United States Patent [19]

Manteghi

[11] Patent Number: 5,800,958
[45] Date of Patent: Sep. 1, 1998

[54] ELECTRICALLY ENHANCED POWER QUAD FLAT PACK ARRANGEMENT

[75] Inventor: Kamran Manteghi, Manteca, Calif.

[73] Assignee: VLSI Technology, Inc., San Jose, Calif.

[21] Appl. No.: 847,880

[22] Filed: Apr. 28, 1997

Related U.S. Application Data

[62] Division of Ser. No. 581,294, Dec. 28, 1995, Pat. No. 5,646,831.

[51] Int. Cl.⁶ .................................................... H01L 21/44
[52] U.S. Cl. .................... 438/123; 438/111; 438/124
[58] Field of Search .......................... 438/110, 111, 438/112, 123, 124, 125, 126, 127

[56] References Cited

U.S. PATENT DOCUMENTS

| | | | |
|---|---|---|---|
| 5,382,546 | 1/1995 | Yamada et al. | 438/123 |
| 5,474,957 | 12/1995 | Urushima | 438/123 |
| 5,480,841 | 1/1996 | Bickford et al. | 438/123 |
| 5,518,957 | 5/1996 | Kim | 438/123 |

*Primary Examiner*—Kevin Picardat
*Attorney, Agent, or Firm*—Patrick T. King

[57] ABSTRACT

A quad flat pack arrangement which provides for an electrically enhanced integrated-circuit package structure is disclosed. An integrated-circuit die is centrally attached to the top surface of a thermally-conductive, and electrically conductive or insulated substrate. A lead frame having a plurality of inwardly-extending bonding fingers has the bottom sides thereof attached to the top surface of the substrate by a non-conductive adhesive so that an open portion thereof overlies the integrated-circuit die. The plurality of bonding fingers are disposed so as to peripherally surround the integrated-circuit die. A double-sided printed circuit board having first and second conductive layers disposed on its opposite sides is disposed over and bonded to the lead frame. Bonding wires are used to interconnect bonding pads on the integrated-circuit die to the first and second conductive layers. A plastic material is molded around the substrate, die, lead frame, printed circuit board and conductive layers.

6 Claims, 5 Drawing Sheets

ELECTRICALLY ENHANCED POWER QUAD FLAT PACK ARRANGEMENT

This is a divisional of application of U.S. Ser. No.: 08/581,294 filed: Dec. 28, 1995 now U.S. Pat. No. 5,646,831.

BACKGROUND OF THE INVENTION

This invention relates generally to semiconductor integrated circuit packages and more particularly, to an improved power quad flat pack arrangement which provides an electrically enhanced integrated-circuit package structure.

As is generally known in the art, an integrated circuit is formed on a small, substantially planar, piece of semiconductor material such as silicon, known as a chip or integrated-circuit die. The integrated-circuit die generally contains a number of circuits therein and includes a plurality of bonding pads disposed on its top surface adjacent its peripheral edges. In a conventional quad flat pack (QFP) package assembly, the integrated-circuit die is mounted to a centrally-located die-attach paddle, or pad, of a thin metal lead frame which is typically stamped or chemically etched from strips of copper-containing materials. The die-attach paddle is rectangular in shape and is supported at each of its four corners by a radially extending support beam.

The lead frame includes a plurality of thin, closely-spaced conductive leads whose inner ends radially extend away from the edges of the die. The inner ends of the conductive leads are called bonding fingers. Very thin gold bonding-wires have their one ends bonded to the corresponding bonding pads on the integrated-circuit die and their other ends bonded to the corresponding bonding fingers. The entire assembly thus described is encapsulated in a molded plastic material so as to form a molded-plastic package body.

As advancements are made in semiconductor integrated-circuit of packaging and assembly technologies, the semiconductor integrated-circuit devices themselves are becoming smaller and smaller, which permits higher packing densities and faster speeds of operation. However, this has caused many manufacturing and processing problems, as well as associated increased cost of quad flat pack assemblies. For example, as the packing density becomes higher and higher, there is created a large amount of heat dissipation by the semiconductor integrated-circuit devices, which may cause a reduction in their overall performance, as well as possible damage or failure of the integrated-circuit devices themselves. In addition, as the operating speeds increase, the problems of inductance within the power conductions of an integrated-circuit and to associated power leads become significantly more important. These inductances within the integrated-circuit devices and in its associated leads may cause ground bounce noise, thereby degrading its high speed of performance.

Accordingly, there has arisen a need for improved power quad flat pack arrangement which has enhanced thermal characteristics. This is achieved in the present invention by the provision of a double-sided printed circuit board having VSS ground and VDD power planes disposed on its opposite surfaces and attached to appropriate power leads of a lead frame.

SUMMARY OF THE INVENTION

Accordingly, it is a general object of the present invention to provide an improved power quad flat pack arrangement, which is relatively simple in its construction and is easy to manufacture and assemble, but yet overcomes the problems of the prior art quad flat pack assemblies.

It is an object of the present invention to provide an improved power quad flat pack arrangement which provides for an electrically enhanced integrated-circuit package structure.

It is another object of the present invention to provide an improved power quad flat pack package arrangement and a method for fabricating the same which has enhanced electrical power distribution characteristics.

It is still another object of the present invention to provide an improved power quad flat package arrangement which includes a double-sided printed circuit board having VSS ground and VDD power planes disposed on its opposite surfaces.

In accordance with a preferred embodiment of the present invention, there is provided a power quad flat package arrangement which provides for an electrically enhanced integrated-circuit package structure. A thermally-conductive substrate is provided which has a top surface. An integrated-circuit die is centrally attached to the top surface of the thermally-conductive substrate. A lead frame has a plurality of inwardly-extending bonding fingers and a centrally-located open portion such that the lead frame has no die-attach pad. The lead frame has the bottom side of the bonding fingers attached to the top surface of the substrate by a non-conductive adhesive so that the open portion thereof overlies the integrated-circuit die. The plurality of bonding fingers are disposed peripherally surrounding the integrated-circuit die attached to the substrate.

A first conductive bottom layer of a double-sided printed circuit board is disposed over and bonded to the top surface of the lead frame so as to peripherally surround the integrated-circuit die. A second conductive top layer of the double-sided printed circuit board also surrounds the integrated-circuit die. Bonding wires are used to interconnect bonding pads formed on the integrated-circuit die and the first and second conductive layers or the lead frame fingers. A plastic molding material is molded around the substrate, die, lead frame, printed circuit board, and conductive layers.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
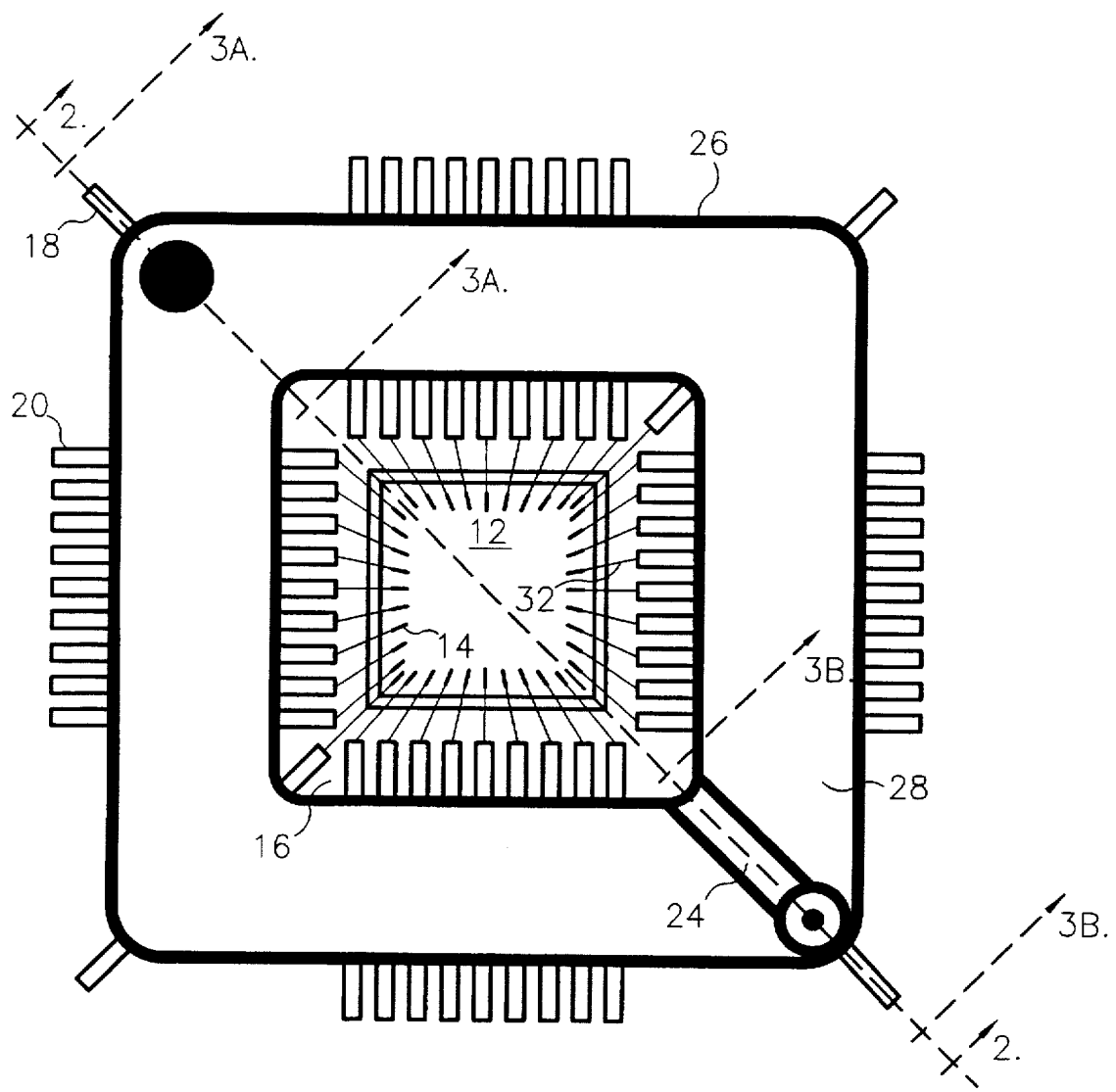
FIG. 1 is a top view of one embodiment of an improved power quad flat pack arrangement, constructed in accordance with the principles of the present invention.
Figure 2:
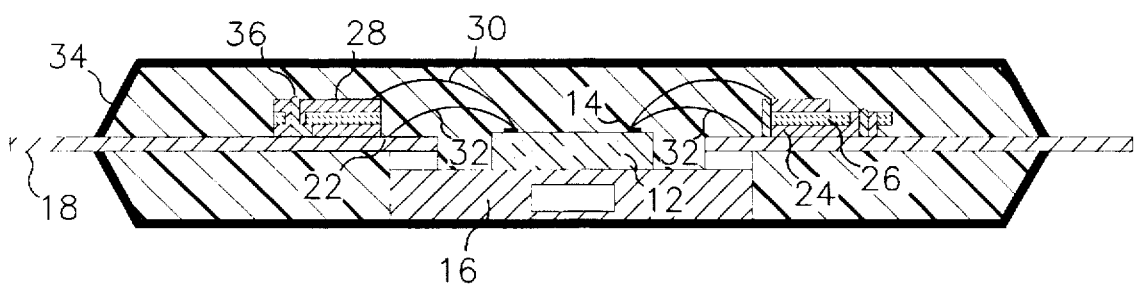
FIG. 2 is a side sectional view, taken along the section line 2—2 of FIG. 1.
Figure 3A:
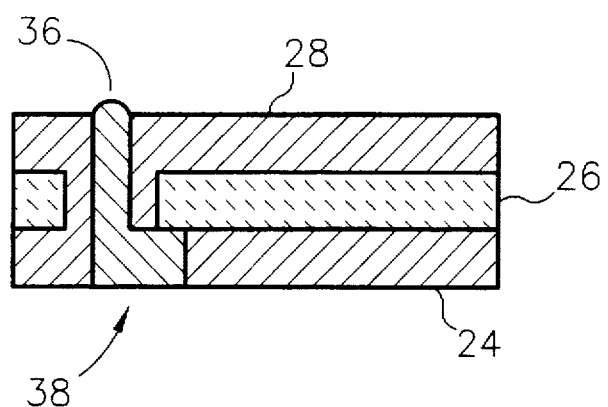
FIGS. 3(A) and 3(B) are enlarged sectional views of portions of FIG. 2, taken along the respective section lines 3(A)—3(A) and 3(B)—3(B) of FIG. 1.
Figure 3B:
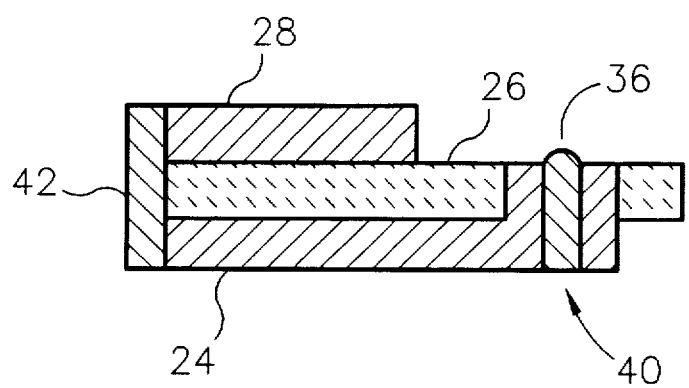

In FIGS. 1, 2, 3(A), and 3(B), there is shown an improved power quad flat pack arrangement 10, which is constructed in accordance with the principles of the present invention. FIG. 1 shows a top view of a power quad flat pack arrangement 10, which includes a die-down, heatsink-up power quad package configuration, in accordance with the present invention. FIG. 2 shows a side sectional view, which is seen from the section line 2—2 of FIG. 1. FIGS. 3(A) and 3(B) are enlarged views of portions of FIG. 2.

The power quad flat pack arrangement 10 includes a semiconductor integrated-circuit die or chip 12 having a plurality of bonding pads 14 formed on its top surface. The integrated-circuit die 12 is adhesively attached to the center area of a thermally-conductive substrate 16. The substrate 16 may be suitably formed from a number of materials which are known in the art, such as copper or a thermally-conductive electrically-insulated material such as a ceramic material, or anodized aluminum. In order to improve the thermal performance of the quad flat pack arrangement, the substrate 14 may be made in the form of a slug of copper or other similar conductive material and the chip 12 attached thereto using a layer of electrically non-conductive adhesive. This sub-assembly is typically encapsulated into a final power quad flat pack arrangement 10 by molding a package body formed of a molded plastic material around the subassembly.

A non-conventional lead frame 18 without a central die-attach pad has a plurality of inwardly-extending conductive leads 20 with the inner ends of the lead forming bonding fingers 22. The bottom surface of the conductive leads 20 and the bonding fingers 22 are attached directly to the top surface of the thermally-conductive, electrically-insulated substrate or copper slug 16. The bonding fingers are attached to the substrate or copper slug by an epoxy material or the like, such as a one mil-thick film of R-Flex 1000 film. The lead frame 18 has no die-attach pad and is typically stamped or chemically etched from a sheet of lead frame material. The type of suitable lead frame material includes copper, iron, nickel, aluminum or alloys containing these materials.

Further, the conductive leads 20 may be plated with a highly conductive metal such as tin/lead solder. It will be noted that the lead frame 18 is non-conventional since it does not have a die-attach pad, but has a centrally-located open portion 109. The bonding fingers 22 of the lead frame 18 extend around the outer margins of the top surface of the substrate or slug 14 and are arranged so as to peripherally surround the die 12.

A first bottom layer having conductive layers 24 formed thereupon of a double-sided printed circuit board 26 is positioned over and bonded to the top surface of the conductive leads 20 using a then layer of non-conductive adhesive (not shown). The core of the printed circuit board 26 is formed of a non-conductive, hermetic material such as, for example, ceramic, molded plastic, or other suitable material.

A second top layer 28 is formed on the double-sided printed circuit board 26. The first and second layers 24 and 28 of conductive material on the printed circuit board 26 are preferably formed of a material such as gold-plated copper or other suitable conductive materials.

As can be seen from FIGS. 1 and 2, there are illustrated a plurality of bonding wires which are used for connecting the respective bonding pads 14 on the integrated-circuit die to various points on the power quad flat pack subassembly. The first conductive bottom layer 24 is used as a large-area, low-inductance, conductive VSS ground plane. Similarly, the second conductive top layer 28 is used as a large-area, low-inductance, conductive VDD power plane.

The top surface of the semiconductor integrated-circuit die 12 has the plurality of bonding pads 14 formed thereon, some of which are used for power and ground connections and others of which are used for signal input/output (I/O) connections. For example, a typical bonding pad for providing power to the die 12 is connected by a thin gold wire 30 directly to the VDD power plane 28. Similarly, it should be understood that a typical ground pad on the die 12 may be connected by another gold wire shown in FIG. 1 directly to the VSS ground plane 24.

The power and ground planes provided by the respective layers 28 and 24 permit additional leads on the lead frame to be available for use as other connections, such as input/output connections. Further, bonding wires 32 are bonded between corresponding ones of the I/O signal bonding pads formed on the top surface of the integrated-circuit die 12 and the corresponding ones of the bonding fingers 22 on the lead frame 18. Also, the VDD power and VSS ground planes are connected to appropriate conductive leads 20 of the lead frame by solder 36 which are used to fill respective plated-through holes 38 and 40 (shown in FIGS. 3(A) and 3(B).

With reference to FIGS. 2, 3(A) and 3(B), it will be noted that the first conductive bottom layer 24, the printed circuit board 26, with the second conductive top layer 28 is each formed as open rectangular window frame having a width which extend from adjacent the outermost part of the bonding fingers to substantially the intermediate area of the conductive leads 20 of the lead frame 18. FIG. 3(A) shows one corner of the package where layer 28 extends over the top of the printed circuit board. In the corner, the bottom conductive layer 24 does not extend all the way to the corner of the printed circuit board. The plated through hole 38 is formed to provide a solder connection from the top layer 28 to the power leads of the leadframe. The bottom layer is attached to a ground lead of the leadframe.

FIG. 3(B) shows another corner of the package where a portion of the top layer 28 is connected with a plated edge 42 to the bottom layer 24 to provide a ground connection segment in the other corner of the package. In this corner, the top layer 28 does not extend all the way to the corner of the printed circuit board. The plated-through hole 40 is formed to provide a solder connection from the bottom layer 24 to the ground leads of the leadframe.

After the wire bonding process, the substrate or slug 16, die 12, lead frame 18, printed circuit board 26 with first and second conductive layers 24, 28 are placed in a mold cavity and hermetically sealed or encapsulated with a plastic molding compound 34 forming a package body and provide the power quad flat package arrangement 10. The molding compound may, for example, be a standard molding compound such as provided by the Sumitomo Company as 6300 HS or HG molding compound or as 7320C low viscosity molding compound.

As a result, there is provided an improved power quad flat pack arrangement 10 which is more reliable and is lower in cost to manufacture and assemble. Further, the present power quad flat package arrangement 10 can dissipate higher amounts of heat due to the enhanced thermal dissipation characteristics via the use of the copper slug or a thermally conductive electrically conductive insulated substrate attached to the bottom surface of the integrated-circuit die 12. In addition, by using the double-sided printed circuit board 26 with the first conductive layer 24 functioning as a ground plane attached on its bottom surface and with the second conductive layer 28 functioning as a power plane attached to its top surface, the inductance of these connections to the integrated-circuit die can be reduced, thereby decreasing ground bounce noise and cross-talk.

Figure 4:
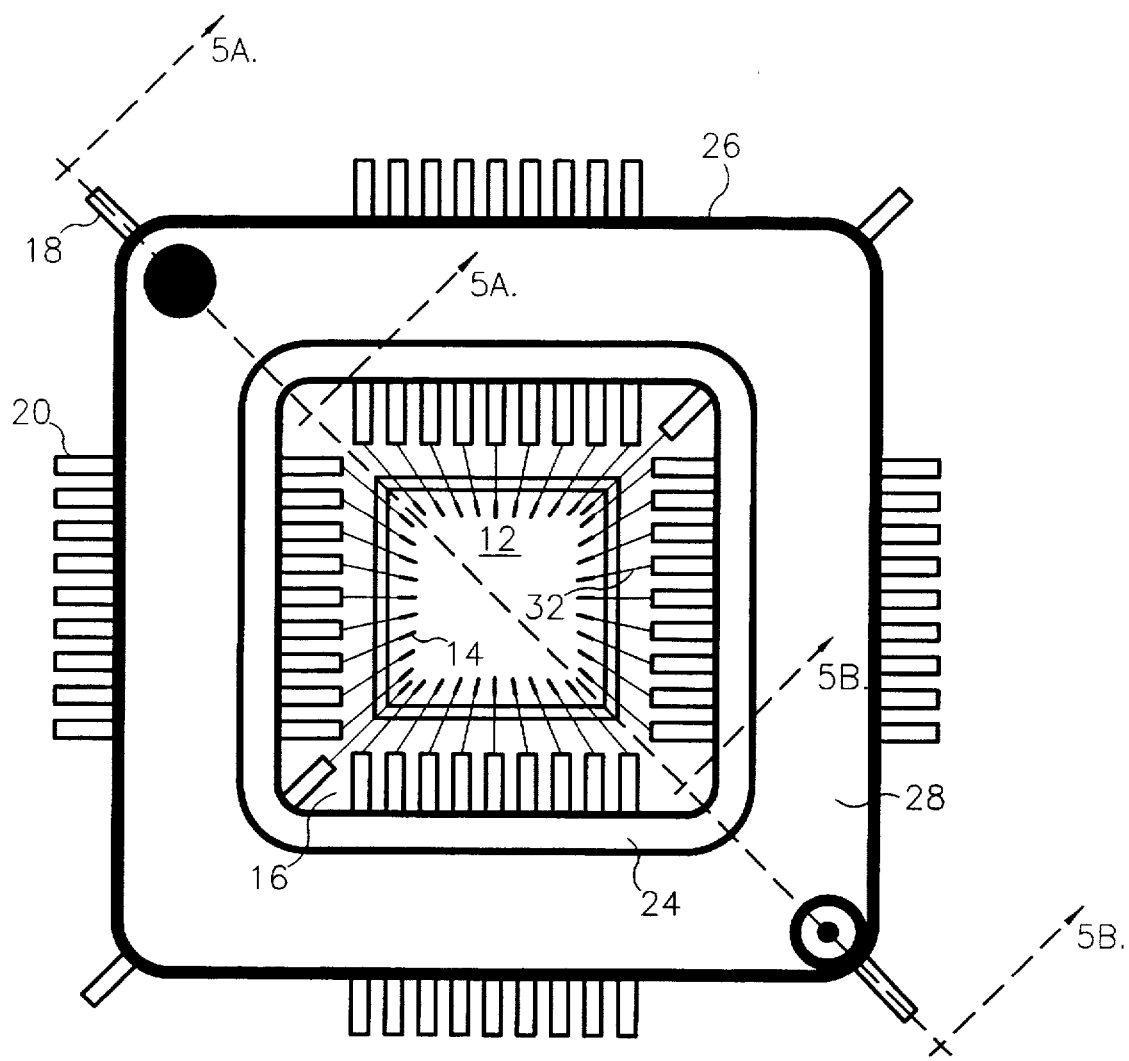
FIG. 4 is a top plan view of a second embodiment of a power quad flat pack arrangement in accordance with the present invention.
Figure 5A:
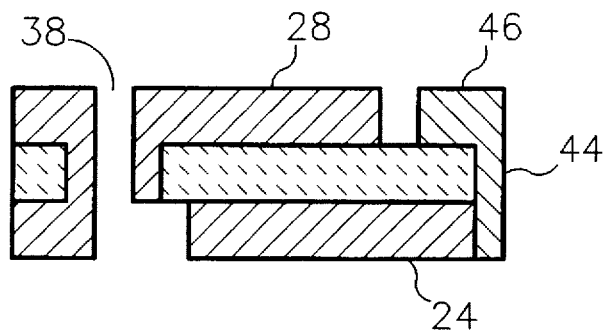
FIGS. 5(A) and 5(B) are enlarged sectional views of, portions of FIG. 4, taken along respective section lines 5(A)—5(A) and 5(B)—5(B) of FIG. 4.
Figure 5B:
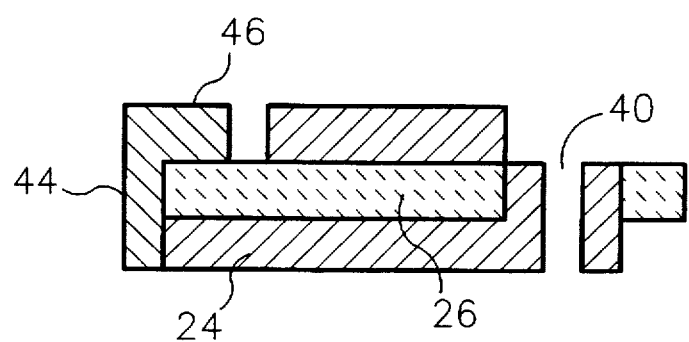

In the alternate embodiment of FIGS. 4, 5(A) and 5(B), the inner edges of the top first conductive layer 24 do extend inwardly of the printed circuit board 26. FIG. 4 shows an alternative embodiment which is similar to that shown in FIG. 2. As shown in FIGS. 5(A) and 5(B) the inner edges of the printed circuit board have plated edges 44 which connect the bottom layer 24 to a portion 46 of the top layer 28 to provide ground connections.

From the foregoing detailed description, it can thus be seen that the present invention provides an improved quad flat pack arrangement for packaging an electrically enhanced integrated-circuit die. The quad flat pack arrangement of the present invention includes a double-sided printed circuit board having first and second conductive layers disposed on its opposite surfaces. The conductive layers are used as ground and power planes and are attached to appropriate leads of a lead frame. This approach provides a quad flat pack arrangement which has enhanced electrical characteristics.

What is claimed is:

1. A method of fabricating a power quad flat pack arrangement for an electrically enhanced integrated-circuit, comprising the steps of:

mounting centrally an integrated-circuit die to a top surface of a substrate;

attaching a lead frame having a centrally-located open portion onto the top surface of the substrate so that the bonding fingers thereof peripherally surround the integrated-circuit die;

bonding a first conductive layer of a double-sided printed circuit board to the top surface of the bonding fingers of the lead frame so as to peripherally surround the integrated-circuit die;

providing a second conductive layer on the top surface of the printed circuit board;

electrically connecting the top layer of the printed-circuit board to one or more bonding fingers of the lead frame;

electrically connecting the bottom layer of the printed-circuit board to one or more bonding fingers of the lead frame;

interconnecting bonding wires between bonding pads on the integrated-circuit die and the first and second conductive layers and between said bonding fingers; and molding a plastic material over the integrated-circuit die, lead frame, printed circuit board and conductive layers and around a portion of the substrate to leave an exposed back surface of said substrate.

2. The method of claim 1 for fabricating a power quad flat pack arrangement for an electrically enhanced integrated-circuit wherein the step of electrically connecting the top layer of the printed-circuit board to one or more bonding fingers of the lead frame includes the step of providing one or more plated-through holes and plated-edges formed in the printed-circuit board, wherein said plated-through holes are adapted to having solder material being provided therein to provide respective electrical connections between the top layer of the printed-circuit board and the one or more bonding fingers.

3. The method of claim 1 for fabricating a power quad flat pack arrangement for an electrically enhanced integrated-circuit wherein the step of electrically connecting the bottom layer of the printed-circuit board to one or more bonding fingers of the lead frame includes the step of providing one or more plated-through holes and plated-edges formed in the printed-circuit board, wherein said plated-through holes are adapted to having solder material being provided therein to provide respective electrical connections between the bottom layer of the printed-circuit board and the one or more bonding fingers.

4. The method of claim 1 for fabricating a power quad flat pack arrangement for an electrically enhanced integrated-circuit wherein said thermally-conductive substrate is a copper slug having a top surface on which is centrally mounted an integrated-circuit die and having a bottom surface which is exposed after the step of molding the plastic material.

5. The method of claim 1 for fabricating a power quad flat pack arrangement for an electrically enhanced integrated-circuit wherein said thermally-conductive substrate is a thermally-conductive, electrically-insulated substrate material which has a top surface on which is centrally mounted an integrated-circuit die and which has a bottom surface which is exposed after the step of molding the plastic material.

6. The method of claim 1 for fabricating a power quad flat pack arrangement for an electrically enhanced integrated-circuit including the step of using said first and second conductive layers as ground and power planes for said integrated-circuit die.

* * * * *